United States Patent [19]
O'Malley et al.

[11] Patent Number: 6,049,463
[45] Date of Patent: Apr. 11, 2000

[54] MICROELECTRONIC ASSEMBLY INCLUDING AN ANTENNA ELEMENT EMBEDDED WITHIN A POLYMERIC CARD, AND METHOD FOR FORMING SAME

[75] Inventors: Grace M. O'Malley, Hoffman Estates, Ill.; Lillian C. Thompson, Phoenix, Ariz.; George Amos Carson, Elk Grove Village; Iwona Turlik, Barrington, both of Ill.

[73] Assignee: Motorola, Inc., Schaumburg, Ill.

[21] Appl. No.: 08/900,403

[22] Filed: Jul. 25, 1997

[51] Int. Cl.[7] ........................................ H05K 7/02
[52] U.S. Cl. .................... 361/760; 361/761; 361/764; 361/737; 361/220; 174/35 R; 174/255; 235/380; 235/439; 235/492; 235/451; 257/679
[58] Field of Search ................... 361/760, 761, 361/764, 737, 220, 212, 777; 174/35 R, 35 GC, 255; 235/380, 439, 492, 451, 488, 487, 486; 257/679

[56] References Cited

U.S. PATENT DOCUMENTS

| | | | |
|---|---|---|---|
| 5,311,396 | 5/1994 | Steffen | 361/736 |
| 5,612,532 | 3/1997 | Iwasaki | 235/492 |
| 5,671,525 | 9/1997 | Fidalgo | 29/600 |
| 5,677,568 | 10/1997 | Ochi et al. | 257/679 |
| 5,703,755 | 12/1997 | Flesher et al. | 361/737 |

*Primary Examiner*—Leo P. Picard
*Assistant Examiner*—David Foster
*Attorney, Agent, or Firm*—Douglas D. Fekete

[57] ABSTRACT

A microelectronic assembly (10) includes a polymeric card (12) that includes a substantially planar major surface (18). An integrated circuit component (14) is embedded in the polymeric card (12) and has a first contact (20) and a second contact (22). An antenna element (16) is formed of a singular metallic strip and includes a first terminal (26) electrically connected to the first contact (20), a second terminal (28) electrically connected to the second contact (22), and a loop (30) intermediate the first terminal (26) and the second terminal (28). The first terminal (26) includes a first outer surface (32) and the second terminal (28) includes a second outer surface (34). The first outer surface (32) and the second outer surface (34) are exposed at the major surface (18) and are coextensive therewith. The loop (30) is embedded within the polymeric card (12) and spaced apart from the major surface (18).

10 Claims, 1 Drawing Sheet

MICROELECTRONIC ASSEMBLY INCLUDING AN ANTENNA ELEMENT EMBEDDED WITHIN A POLYMERIC CARD, AND METHOD FOR FORMING SAME

FIELD OF THE INVENTION

This invention relates generally to a microelectronic assembly including an antenna element. More particularly, this invention relates to a microelectronic assembly including an antenna element embedded within a polymeric card.

BACKGROUND OF THE INVENTION

A smart card assembly includes an integrated circuit component embedded within a polymeric card, typically a credit-card-sized assembly. The integrated circuit component contains information, such as access privileges, account balances, and security information. Smart card assemblies include electrical contacts at the surface of the smart card that permit electrical access to information stored in the integrated circuit component. The integrated circuit component is connected to the electrical contacts to allow a reader to make physical contact with the electrical contacts to permit the transfer of signals to and from the integrated circuit component for processing.

Contactless cards have been developed to allow utilization of the contactless card without physical contact with a mechanical reader head, thereby making the contactless cards faster to use and their functionality more transparent to the user. An antenna is typically disposed within the card to receive a signal transmitted from a base unit and to transmit a signal back to the base unit. In a contactless card, the integrated circuit component is typically embedded in the card, and is not attached to metal contacts at the surface of the card. In this manner, the position of the integrated circuit component is not based upon a need to be attached to contacts exposed at the surface of the card.

It is desired to form a microelectronic assembly that includes the functionality of both the contact card and the contactless card. Such dual interface smart cards, commonly referred to as combi-cards, include both contact pads at the surface of the card and contactless capabilities.

It has been difficult to achieve acceptable results with dual interface smart cards. The process of connecting the embedded antenna to the integrated circuit component that has been attached to the external contacts has been difficult to achieve reliably. One proposed solution has been to include two integrated circuit components within each dual interface smart card, one for the contact function and one for the contactless function. However, this approach leads to a more expensive smart card and a more complicated manufacturing process.

One approach that has been proposed is to laminate a polymeric card about an antenna, an integrated circuit component, and a contact pad. Such a technique is difficult to accomplish without damaging the components, due to the tight tolerances required during the lamination process and the relatively fragile components when subjected to the heat and pressure of the lamination process.

In typical smart card assemblies, the antenna is embedded within the card during a lamination step, and later attached to the integrated circuit component by forming openings in the laminated card to expose the antenna element within the openings. This leads to difficulties in processing and a complicated attachment process, as the integrated circuit component that is attached to the embedded antenna has to be connected to the contacts that are exposed at the surface of the finished card. In prior combi-card assemblies, this process has been accomplished in two steps, by first embedding the antenna and then making connection to the antenna within the polymeric card.

Therefore, a need exists for an antenna that can be directly attached to the integrated circuit component and contacts exposed at the surface of the combi-card and reliably formed in a polymeric card.

DETAILED DESCRIPTION OF A PREFERRED EMBODIMENT

The present invention forms a microelectronic assembly, such as a smart card, that includes an integrated circuit component and an antenna element embedded in a polymeric card. The integrated circuit component includes a first contact and a second contact. The antenna element is formed of a singular metallic strip and includes first and second terminals electrically connected to the first and second contacts, respectively. The first terminal includes a first outer surface and the second terminal includes a second outer surface. The outer surfaces are exposed at the major surface of the polymeric card and are coextensive therewith. In this manner, the surfaces are exposed at the major surface of the polymeric card to provide physical and electrical connection to the integrated circuit component. The antenna element includes a loop that is intermediate the first and second terminals. The loop is embedded within the polymeric card and is spaced apart from the substantially planar major surface to be embedded within the polymeric card.

Figure 1:
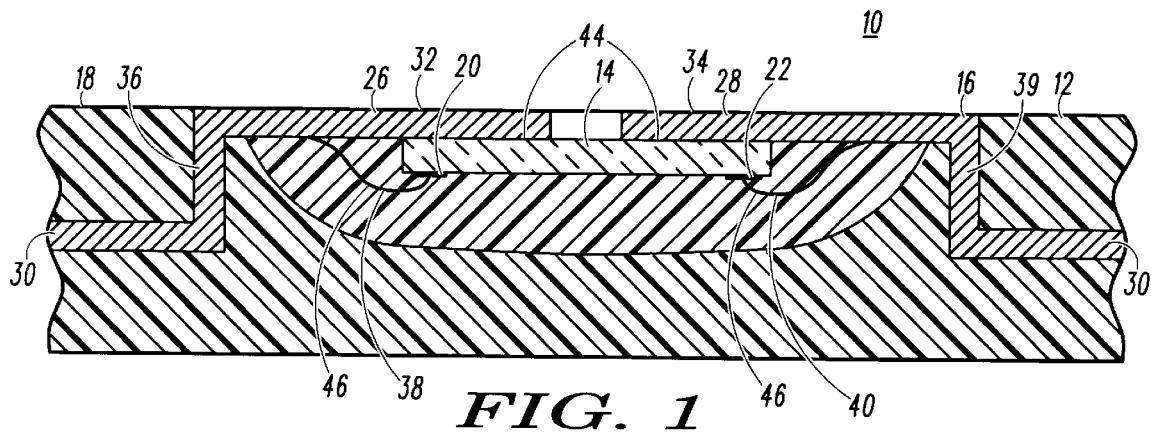
FIG. 1 is a cross-sectional view of a portion of a microelectronic assembly including an integrated circuit component and an antenna element embedded in a polymeric card in accordance with a preferred embodiment of the present invention.
Figure 2:
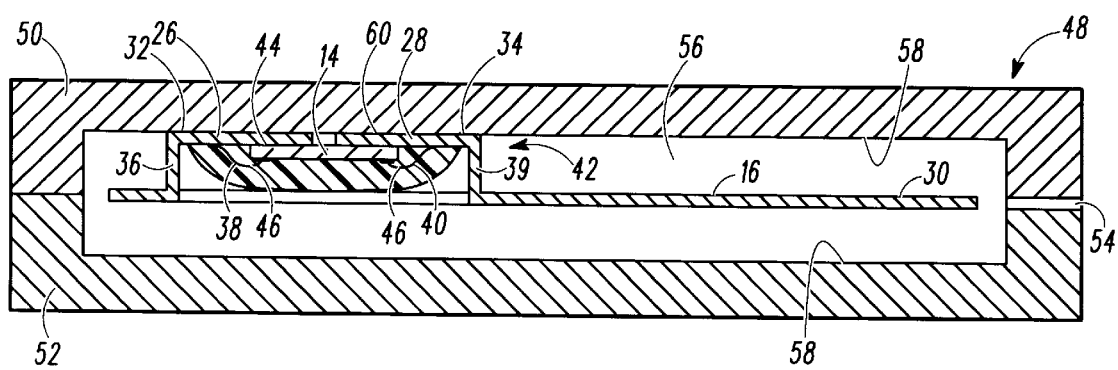
FIG. 2 is a cross-sectional view of a preassembly including an antenna element connected to an integrated circuit component and disposed in a mold in accordance with a preferred embodiment of the present invention.

The present invention can be better understood with reference to FIGS. 1 and 2. FIG. 1 shows a microelectronic assembly 10, such as a smart card, formed in accordance with a preferred embodiment of the present invention. Microelectronic assembly 10 includes an integrated circuit component 14, a polymeric card 12, and an antenna element 16 embedded within polymeric card 12. Polymeric card 12 includes a substantially planar major surface 18. Integrated circuit component 14 is embedded within polymeric card 12.

Integrated circuit component 14 is preferably an integrated circuit die formed of silicon. Alternately, integrated circuit component 14 may be an integrated circuit package, such as a ball grid array package, formed by attaching an integrated circuit die to a carrier substrate. Integrated circuit component 14 includes a first contact 20 and a second contact 22. Contacts 20 and 22 are formed of a material, such as aluminum or copper, that is able to have a solder bump or a wire bond attached thereto.

Antenna element 16 is formed of a conductive material, preferably a singular metallic strip. In a preferred embodiment, antenna element is formed of copper, but may alternately be formed of a copper-nickel alloy commonly referred to as INVAR, and other copper alloys. Antenna element 16 is preferably formed by electroplating copper onto a strip and includes a first terminal 26, a second terminal 28, and a loop 30 intermediate first terminal 26 and second terminal 28. First terminal 26 includes a first outer surface 32, and second terminal 28 includes a second outer surface 34. First outer surface 32 and second outer surface 34 are exposed at substantially planar major surface 18, and are preferably coextensive therewith. Antenna element 16 may alternately be formed by stamping, etching, or any other suitable technique.

Loop 30 is embedded in polymeric card 12 and is spaced apart from substantially planar major surface 18 by a predetermined distance. Loop 30 is spaced apart from major surface 18 by a distance that is large enough to allow a prepolymer or a liquid thermoplastic to flow between loop 30 and major surface 18. In a preferred embodiment, the predetermined distance is between about 125 and 1125 microns (between about 5 and 45 mils).

Integrated circuit component 14 is attached to antenna element 16 to form preassembly 42, as depicted in FIG. 2. In a preferred embodiment, integrated circuit component 14 is attached to die attach region 44 with an adhesive or the like and electrically connected to contacts 20 and 22. A first connection 38 connects first terminal 26 and first contact 20, and a second connection 40 connects second terminal 28 and second contact 22. First connection 38 and second connection 40 are preferably wire bonds 46, but may alternately be solder bump interconnections. First terminal 26 is preferably wire bonded to first contact 20 and second terminal 28 is preferably wire bonded to second contact 22. After connection, component 14 and wire bonds 46 may be encapsulated with a polymeric encapsulant, such as an epoxy filled with silica or alumina particles.

In an alternate embodiment, the first and second terminals are attached to the first and second contacts, respectively, via solder bump interconnections. To achieve such interconnections, a solder bump is formed on each of the contacts. The solder bumps are preferably formed of a eutectic or near eutectic tin-lead solder alloy. A suitable tin-lead alloy is composed of about 63 weight percent tin and the balance substantially lead and has a melting temperature of about 183° C. The solder bumps may be formed by electroplating, electroless plating, evaporation, sputtering, stencil printing, or any other suitable technique. Alternately, the bumps may be formed of an electrically conductive polymeric material, such as a conductive epoxy resin.

In the alternate embodiment, the component is then superposed onto the die attach region such that each solder bump registers with a corresponding terminal. The component and the solder bumps are heated to a temperature sufficient to reflow the solder bumps onto the terminals to form solder bump interconnections that electrically connect the first terminal to the first contact and the second terminal to the second contact. The component may then be underfilled with a polymeric encapsulant such as an epoxy formulation filled with silica or alumina particles, to provide enhanced reliability to the solder bump interconnections.

In a preferred embodiment, antenna element 16 is deformed such that first segment 36 and second segment 39 are formed. First segment 36 integrally connects first terminal 26 and loop 30, and second segment integrally connects second terminal 28 and loop 30. Segments 36 and 39 preferably extend nonparallel to substantially planar major surface 18 and are effective to position loop 30 within polymeric card 12 such that card 12 integrally encircles loop 30. In this manner, loop 30 is disposed in a plane that is spaced apart from a plane defined by terminals 26 and 28.

Component 14 is preferably attached to antenna element 16 subsequent to deformation of antenna element 16, but may alternately be attached to antenna element 16 prior to deformation of antenna element 16 to form segments 36 and 39.

Preassembly 42 is then placed into a mold 48, as depicted in FIG. 2. Mold 48 is preferably formed of tool carbon steel, but can alternately be formed of aluminum or stainless steel. Mold 48 includes a first plate 50, a second plate 52, and a nozzle 54. First plate 50 and second plate 52 cooperate to define a mold cavity 56 that defines the outline of the finished polymeric card 12. In a preferred embodiment, mold cavity 56 is compatible with International Standards Organization standard ISO 7810. ISO 7810 has nominal dimensions of 0.76 mm thick, 85.6 mm wide, and 53.98 mm long. Preassembly 42 is placed into mold cavity 56 such that loop 30 is spaced apart from the mold surfaces 58. Mold cavity 56 includes an opening 60 and first outer surface 32 and second outer surface 34 are exposed through opening 60 and are preferably coextensive therewith.

Mold 48 is held together under force and heated to about 175° C. A liquid polymer is injected into mold cavity 56 through nozzle 54 and encircles loop 30. The liquid polymer covers integrated circuit component 14. The liquid polymer fills mold cavity 56 and forms and is shaped against molding surface 58. In a preferred embodiment, the liquid polymer is a thermoplastic material. The thermoplastic material is injected into mold cavity 56 in a liquid state, and subsequently hardened to form polymeric card 12. Mold 48 is then removed from polymeric card 12. The polymeric material is preferably composed of unfilled acrylonitrile butadiene styrene (ABS).

A polymeric precursor of a thermoset resin may alternately be injected into mold cavity 56. Polymeric precursor 36 is preferably preheated and is injected into mold cavity 56 through nozzle 54 and encircles loop 30. The polymeric precursor covers integrated circuit component 14. The polymeric precursor fills mold cavity 56 and forms and is shaped against molding surface 58. Polymeric precursor may be composed of a thermoset encapsulant, such as polycarbonate (PC) or polyvinyl chloride (PVC). The polymeric precursor is then cured, such as through heating, to form polymeric card 12. Mold 48 is then removed from polymeric card 12.

Loop 30 is effective as an antenna in a wireless application, such as a contactless smart card or a combicard. In such a smart card, the smart card is brought proximate to a transmitter. Loop antenna 30 receives a signal from the transmitter and inductively transmits a signal back to the transmitter unit. Depending on the signal received by the transmitter unit, different functions may be applied. For example, entrance to a facility may be achieved, access to transportation such as a bus or train may be accomplished, or users may be tracked as they enter or move about a facility.

The present invention provides a microelectronic assembly and the method for forming the assembly formed by placing a preassembly into a mold cavity. The preassembly is formed of an integrated circuit component attached to an antenna element. The antenna element is preferably formed of a metallic strip and includes a first segment and a second segment that connect the first terminal and the second terminal to a loop intermediate the first and second terminals. The segments displace the loop from the terminals to place the loop in a different plane from the plane defined by the first and second terminals. In this manner, when the antenna element is placed into the mold cavity, the loop is spaced apart from the mold surfaces by a predetermined distance. When a liquid polymer, such a polymeric precursor or a liquid thermoplastic, the liquid polymer flows about and encircles the loop. Upon hardening, the precursor forms a singular injection molded polymeric body that completely encircles the loop. In this manner, the loop is protected from environmental damage by the polymeric card.

A microelectronic assembly is thereby formed, such as a smart card, that includes the functionality of a contact smart card and a contactless smart card and thereby forms a dual interface smart card. The smart card formed is able to be placed into an electromechanical reader that, through contacts on the surface of the card, is able to send and receive data to the integrated circuit located in the card. The smart card formed is also able to be used as a contactless smart card. As a contactless smart card, the smart card formed can be brought within transmitting distance of a transmitting unit that sends out a signal over the air. The signal, when received by the loop antenna located within the polymeric card, is able to detect the signal and transmit a signal to the integrated circuit component. The integrated circuit component may then send a signal back to the transmitting unit through the inductive properties of the loop antenna. In this manner, multiple functions can be achieved. The user of the card can gain access to a facility, may use transportation facility and have a debit account charge, and the like.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
    a polymeric card including a planar major surface and formed of a singular injection molded polymeric body;
    an integrated circuit component embedded in the polymeric card and having a first contact and a second contact;
    an antenna element formed of a singular metallic strip and comprising a loop, a first terminal, a first antenna segment integrally connecting the first terminal and the loop disposed at a non-parallel angle relative to the planar major surface, a second terminal, a second antenna segment integrally connecting the second terminal and the loop and disposed at a non-parallel angle relative to the planar major surface, said first segment and said second segment positioning the loop such that the loop is spaced apart from the planar major surface and such that the polymeric card encircles the loop, the first terminal and the second terminal having outer surfaces exposed at the planar major surface and coextensive therewith;
    a first connection connecting the first contact and the first terminal; and
    a second connection connecting the second contact and the second terminal.

2. A microelectronic assembly in accordance with claim 1, wherein the first connection is composed of a wire bond.

3. A microelectronic assembly in accordance with claim 1, wherein the first connection is composed of a solder bump interconnection.

4. A microelectronic assembly in accordance with claim 1, wherein the loop is spaced apart from the planar major surface by a predetermined distance.

5. A microelectronic assembly in accordance with claim 4, wherein the predetermined distance is between about 125 and 1125 microns.

6. A method for forming a microelectronic assembly comprising an integrated circuit component and a metallic strip antenna encapsulated within a polymeric card having a planar major surface, said method comprising:
    forming a singular metallic strip, said metallic strip including an antenna element comprising a first terminal, a second terminal, and a loop therebetween;
    attaching an integrated circuit component to the metallic strip to form a preassembly, said integrated circuit component including a first contact attached to the first terminal and a second contact attached to the second terminal;
    deforming the singular metallic strip to form a first segment intermediate the first terminal and the loop and a second segment intermediate the second terminal and the loop, the metallic strip being bent such that said first segment and said second segment are disposed at a non-parallel angle relative to the planar major surface of the polymeric card;
    disposing a mold about the preassembly, said mold enclosing the loop and the integrated circuit component; and
    injecting a polymeric material into the mold, said polymeric material encapsulating the integrated circuit component and the loop to form a molded card.

7. A method for forming a microelectronic assembly in accordance with claim 6, wherein the step of deforming the singular metallic lead is done before the step of attaching an integrated circuit component.

8. A method for forming a microelectronic assembly in accordance with claim 6, wherein the step of deforming the singular metallic lead is done after the step of attaching an integrated circuit component.

9. A method for forming a microelectronic assembly in accordance with claim 6, wherein the step of injecting comprises injecting a liquid thermoplastic material into the mold.

10. A method for forming a microelectronic assembly in accordance with claim 6, wherein the step of injecting comprises injecting a polymeric precursor into the mold.

* * * * *